United States Patent [19]

Ikeda

[11] Patent Number: 5,009,860
[45] Date of Patent: Apr. 23, 1991

[54] SEMICONDUCTOR ROD ZONE MELTING APPARATUS

[75] Inventor: Yasuhiro Ikeda, Annaka, Japan
[73] Assignee: Shin-Etsu Handotai Co., Ltd., Tokyo, Japan
[21] Appl. No.: 184,419
[22] Filed: Apr. 20, 1988
[30] Foreign Application Priority Data May 25, 1987 [JP] Japan .................................. 62-125804

[51] Int. Cl.$^5$ ........................ C30B 35/00; C30B 13/30
[52] U.S. Cl. ................................. 422/250; 156/620.7; 75/10.11
[58] Field of Search ...................... 422/250; 156/620.7, 156/620.71, 620.72, 620.73, 620.74, 620.75; 75/10.11

[56] References Cited

U.S. PATENT DOCUMENTS

| 3,342,970 | 9/1967 | Emeis | 156/620.73 |
| 3,607,138 | 9/1971 | Keller | 156/620.73 |
| 3,622,280 | 11/1971 | Keller | 422/250 |
| 3,685,973 | 8/1972 | Keller et al. | 156/620.73 |
| 3,827,017 | 7/1974 | Keller | 156/620.73 |
| 4,045,278 | 8/1977 | Keller | 422/250 |

Primary Examiner—Gary P. Straub
Assistant Examiner—Stephen G. Kalinchak
Attorney, Agent, or Firm—Foley & Lardner

[57] ABSTRACT

According to this invention, a semiconductor rod zone melting apparatus for manufacturing single-crystal semiconductor such as silicon, germanium, and the like and compound semiconductors such as gallium phosphate, and the like by the FZ process is disclosed. In this invention, a substantially U-shaped metal piece is arranged near one of upper and lower side surfaces of an induction heating coil surrounding a floating zone of a semiconductor rod to be melted, the floating zone surrounding space can be varied upon relative movement between the coil and the metal piece toward the radial direction of the coil. The floating zone of the semiconductor rod can be homogeneously and concentratively heated, and zone melting of a large-diameter semiconductor rod is facilitated.

7 Claims, 3 Drawing Sheets

FIG. 3 PRIOR ART (A)
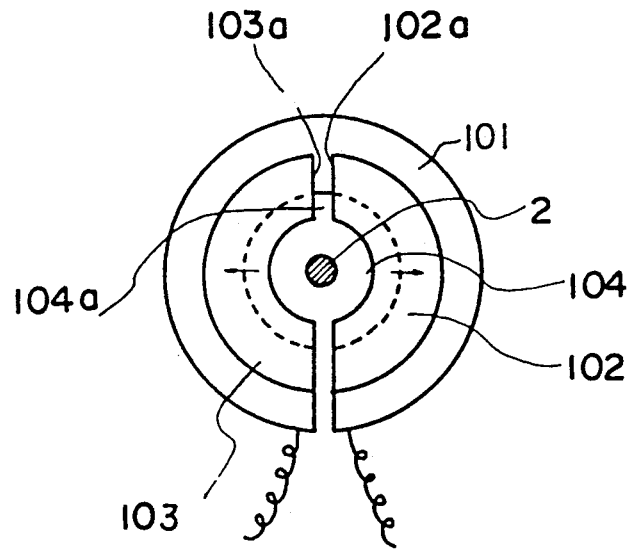
FIG. 3 PRIOR ART (B)
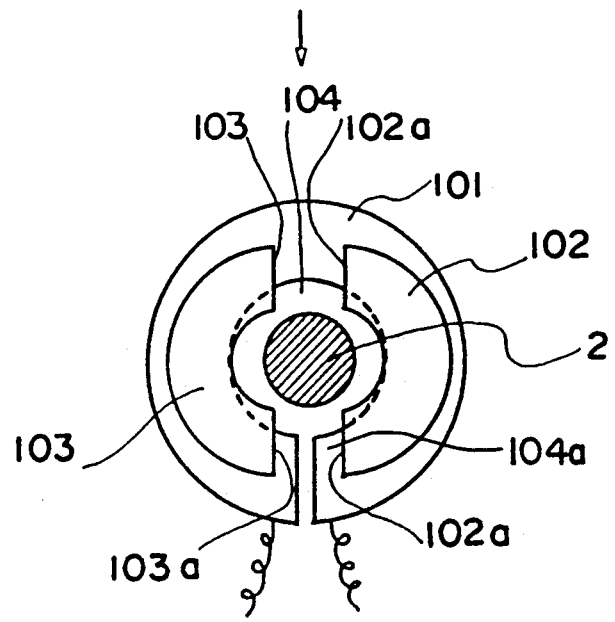

SEMICONDUCTOR ROD ZONE MELTING APPARATUS

BACKGROUND OF THE INVENTION

1. Field of the Invention

The present invention relates to a semiconductor rod zone melting apparatus for manufacturing single-crystal semiconductors such as silicon, germanium, and the like, and compound semiconductors such as gallium phosphate, and the like by a floating-zone melting process (to be referred to as an FZ process hereinafter) and, more particularly, to a semiconductor rod zone melting apparatus wherein a metal piece is arranged close to or on at least one of upper and lower peripheral surfaces of an induction heating coil surrounding a floating zone of a semiconductor rod to be melted, and the space surrounding the floating zone can be varied by adjusting the relative positions of the coil and the metal piece.

2. Description of the Prior Art

A conventional apparatus for manufacturing a semiconductor single crystal is known. In this apparatus, a polycrystalline semiconductor rod as a starting material is held at the bottom of the upper shaft, and a single-crystal seed having a small diameter is held at the top of the lower shaft. One end of the semiconductor rod is melted by an RF induction heating coil surrounding the semiconductor rod and is nucleated on the seed crystal. Thereafter, a single-crystal portion having a smaller diameter than that of the seed crystal is grown at a high speed to obtain a dislocation-free crystal epitaxially from the seed, and at the same time, the semiconductor rod is started to zone melt while relatively rotating about and moving downwardly in the axial direction. In an apparatus of this type, it is preferable that the heating coil is arranged closer to a melting zone with a sufficiently small gap, so that electromagnetic energy is concentratively supplied from the coil to the melting zone. Therefore, like in a single-crystal nucleation process and a subsequent high-speed small-diameter single-crystal growth process, the effective inner diameter of the heating coil is preferably decreased with decreasing of the single crystal. In addition, if the diameter of the single crystal is increased as the melting zone is moved, the inner diameter of the heating coil is preferably increased accordingly. Such a means is further critical for manufacturing a large-diameter single crystal.

For this purpose, a technique (Japanese Unexamined Patent Publication (Kokai) No. 48-8801) has been proposed. In this technique, a multiple-turn main induction heating coil and a ring-shaped movable auxiliary induction heating coil are combined vertically with a small distance apart and both are independently powered. The auxiliary coil is gradually displaced laterally during operation, so that a space surrounding a floating zone defined by the coils may be kept to a minimum. However, in this technique, since RF currents which are respectively supplied to each of the parallel coils, have to precisely coincide in frequency with each other, there are found a great difficulty to achieve uniformity in a surrounding magnetic field around the semiconductor rod.

When a plurality of coils are vertically arranged, even with a small gap, the magnetic field excited by the coils on the semiconductor rod is broadened compared with that by a single coil. Therefore, it is difficult to concentrate a magnetic field to form a narrow floating zone, and hence difficult to operate on the larger diameter. This fact arouses a serious problem of being less able to make the single crystal with a large diameter dislocation free.

In order to eliminate the above drawbacks, another semiconductor rod melting apparatus is proposed (Japanese Patent Publication (Kokoku) No. 56-11674). In this apparatus, as shown in FIGS. 3(A) and 3(B), two arcuated metal pieces 102 and 103 which can be moved on and along the above or under surface of a flat ring-shaped main induction heating coil 101 with constant contact to keep electric conduction. The metal pieces 102 and 103 are moved closer to or away from each other in accordance with the diameter of a single-crystal to be manufactured, so that a space defined by the metal pieces 102 and 103 can be largely varied to keep strong coupling between them and the zone. However, with this prior art technique, the following problem remains unsolved.

More specifically, in an apparatus for manufacturing a semiconductor single crystal with zone-melting using a ring-shaped heating coil, a current flowing through the heating coil is increased as the diameter of a single crystal to be manufactured is increased, thus increasing an induction current generated on a peripheral surface of the semiconductor rod. However, since a large current needs large potential difference across the heating coil, electric discharge is easy to occur at moving electrical contacts of the metal pieces 102 and 103 with the coil 101. In general, since the single crystal is manufactured in an argon gas atmosphere as protection, the electric discharge is easy to occur.

The electric discharge not only adversely influences crystal quality but also causes coils 101, 102, and 103 which are made of copper or silver to be welded to each other.

In the prior art technique, a floating-zone surrounding space 104 is defined by the two arcuated metal pieces 102 and 103 having a smaller arc diameter on their inside than the inner diameter of the heating coil 101. For this reason, as the metal pieces 102 and 103 are separated from each other in accordance with an increase in diameter of a single crystal, as shown in FIG. 3(B), a slit space 104a defined between linear edges 102a and 103a is widened in such a manner that a stepped recess profile 104–104a were formed between the arcuated edges of the metal pieces 102 and 103 and the inner edge of the main induction heating coil 101. Thus, a nonuniform magnetic field is formed at the stepped recess 104–104a, and electromagnetic coupling with the semiconductor rod is reduced there. The nonuniform magnetic field causes floating-zone surrounding space 104a, and inhomogeneity in impurity concentration inside the single crystal since solidification at the growing front is repetitively interrupted.

SUMMARY OF THE INVENTION

The present invention has been made in consideration of the prior art problems, and has as its object to provide a semiconductor rod melting apparatus wherein a gap between a floating zone and a main induction eating coil can be varied with the aid of a U-shaped metal piece which changes the position relative to the main induction heating coil and the floating zone can be obtained with enough stability by improved coupling and besides, narrowly heated all the time with a change in diameter of a melting zone, while greatly improving the uniformity of the electromagnetic field around the melting zone.

It is another object of the present invention to provide a semiconductor rod melting apparatus which can concentratively apply a uniform magnetic field to a narrower floating zone while preventing danger of electric discharge between the coil and the metal piece, and is particularly suitable for manufacturing a large-diameter dislocation-free single crystal.

It is still another object of the present invention to provide a semiconductor rod melting apparatus wherein a uniform magnetic field can always be formed without adversely deforming a floating-zone surrounding space defined between the coils even when the coil and the metal piece are moved in correspondence with an increase in diameter of a manufactured single crystal, so that an improvement of electromagnetic coupling between the coil and a semiconductor rod and prevention of a deterioration therein can be simultaneously achieved.

The above and other objects of the present invention will become more apparent from the following description of the present invention.

According to the present invention, in order to achieve the above objects, there is provided a semiconductor rod melting apparatus in which a U-shaped metal piece (to be referred to simply as a metal piece hereinafter) 20 is arranged to face, at its major surface, at least one of upper and lower side surfaces of a main induction heating coil (to be referred to as a main coil hereinafter) 10 surrounding a floating zone of a semiconductor rod, and a floating-zone surrounding space 30 is varied by a relative movement between the coil 10 and the metal piece 20 along the coil surface. In this apparatus, in particular, a U-shaped inner edge 23 of the metal piece 20 is formed to have an opening width enough to cover at least the inner diameter periphery of the main coil 10. In addition, the upper and lower side surfaces of the coil 10 and the metal piece 20 facing each other are brought into contact through a thin insulating member 21, and the coil 10 and the metal piece 20 can be relatively moved substantially perpendicular to the axial direction of the semiconductor rod 1 without losing the contact between them.

In this case, an RF power supply 40 is connected to only the main coil 10, and the metal piece 20 is set in an electrical isolation. With this arrangement, the coil 10 and the metal piece 20 can electrically serve as a single work coil.

Since the coil 10 and the metal piece 20 can be relatively moved in a direction perpendicular to the axial direction of the semiconductor rod 1, a driver may be provided to at least one of the coil 10 and the metal piece 20; for example, only the metal piece 20 is movable. Drivers 51 and 52 may be provided to both the coil 10 and the metal piece 20, so that the coil 10 and the metal piece 20 are respectively moved closer to or separated from a semiconductor rod by the drivers 51 and 52, positioning the semiconductor rod 1 as their center.

The main coil 10 used in the present invention is a ring-shaped single-turn coil. A single-turn flat coil is used to concentratively apply a uniform magnetic field to a narrower floating zone.

The inner edge 23 of the metal piece has an opening width larger than at least the inner diameter of the main coil 10, and its main portion is preferably formed to have a U-shaped curve having a large curvature (the curve may be part of a circle, an elliptical curve, a hyperbolic curve, or a parabolic curve). If the inner edge 23 is formed to have a true circular arc, its radius of curvature is preferably set to be slightly larger than that of the inner diameter 11 of the main coil 10.

The overall shape of the metal piece 20 having the inner edge 23 as part is not particularly limited. However, the arms of the metal piece 20 have to be so wide that any new empty space may not be idly formed within the original inner space of the coil. In addition, when the arcuated portion is formed to have a large width, an induction current can be concentrated and flowed near the inner edge 23.

The thickness of the metal piece 20 is preferably decreased as small as possible with a view to the field concentration, and the metal piece 20 should be the thinnest possible for improvement on the field uniformity.

The insulating member 21 interposed between the surfaces of the main coil 10 and the metal piece 20 can be independently provided to both the coil 10 and the metal piece 20 or may be planted on one of the opposing surfaces of the coil 10 and the metal piece 20. The number of insulating members is not particularly limited to a specific number. The insulating member 21 is preferably formed of a temperature resistant insulator such as quartz glass and the like which can withstand radiation heat from the floating zone 2.

The insulating member 21 is preferably disposed adjacent to the distal end of one arm 22a of the arcuated portion 22 of the metal piece. Thus, the coil 10 and the metal piece 20 can be relatively moved while maintaining a small gap therebetween with the insulating member 21.

With the above arrangement, the metal piece is formed by the arcuated portion 22 having the inner edge 23 which bridges the inner-diameter space 30 of the main coil 10. Therefore, when the metal piece 20 is relatively moved on and along the coil surface, a space 30 circumscribed between the coil 10 and the metal piece 20 can be changed while being kept in an almost circular shape. Thus, extreme nonuniformity of the magnetic field can be prevented, and electromagnetic coupling between the melting zone 2 and the coil can be improved. A heating temperature can thus be stabilized on a periphery of an object to be melted, thus allowing manufacture of a high-quality semiconductor single crystal.

Since the arcuated portion 22 partially conceals an inner space 30 of the main coil 10, an almost circular shape can be defined between the inner edge 23 of the arcuated portion and the inner diameter periphery 11 of the main coil. Thus, two metal pieces 20 need not be arranged, thus simplifying an arrangement.

The metal piece 20 is disposed to face the upper or lower surface of the main coil 10 and in an electrically non-contact state with the insulating member 21 therebetween. Therefore, if an RF current is flowed through the main coil 10, a current is induced in the metal piece 20, and flows at the inside 23 of the arcuated portion 22 of the metal piece 20 synchronized with the main coil 10. Therefore, the coil 10 and the metal piece 20 operate as if a single coil having an inner space defined between the coil 10 and the metal piece 20 were present.

Therefore, when the coil 10 and the metal piece 20 are relatively moved on and along the coil surface in this state, the main coil operates as if its inner diameter 11 were changed, and the space 30 surrounding the floating zone 2 can be varied. Therefore, nucleation with a seed crystal and the following single crystal growth from a small-diameter (about 3 mm) portion to a large-diameter portion can be stably performed.

In this case, both the coil 10 and the metal piece 20 have a flat shape and a small thickness, and are arranged to have a small gap therebetween with the insulating member 21. Therefore, the effective thickness of the main coil defined by both the coil 10 and the metal piece 20 is not increased, and a magnetic field can be concentratively focused to the narrower floating zone 2, thus facilitating the manufacture of a large-diameter dislocation-free single crystal.

The coil 10 and the metal piece 20 are electrically disconnected from each other. Therefore, even when a large current is flowed through the main coil 10 in correspondence with an increase in diameter of a single crystal, electric discharge can be prevented, and hence, degration in crystal quality caused by the electric discharge and trouble due to welding of the coil and the metal piece can be perfectly prevented.

According to the present invention, the space 30 defined between the main coil 10 and the metal piece 20 can be varied, the electromagnetic coupling between the coil and a semiconductor rod to be melted can be maintained well, and the floating zone can be concentrically and homogeneously in its periphery heated. Therefore, a large-diameter dislocation-free single crystal can be easily manufactured.

BRIEF DESCRIPTION OF THE DRAWINGS

FIGS. 3(A) and 3(B) are schematic top plan views showing positions of coils according the prior art.

DETAILED DESCRIPTION OF THE PREFERRED EMBODIMENT

A preferred embodiment of the present invention will be described with reference to the accompanying drawings. It should be noted that dimensions, materials, shapes, and relative positional relationship of components described in this embodiment are merely examples and do not limit the scope of the present invention unless otherwise specified.

Figure 1:
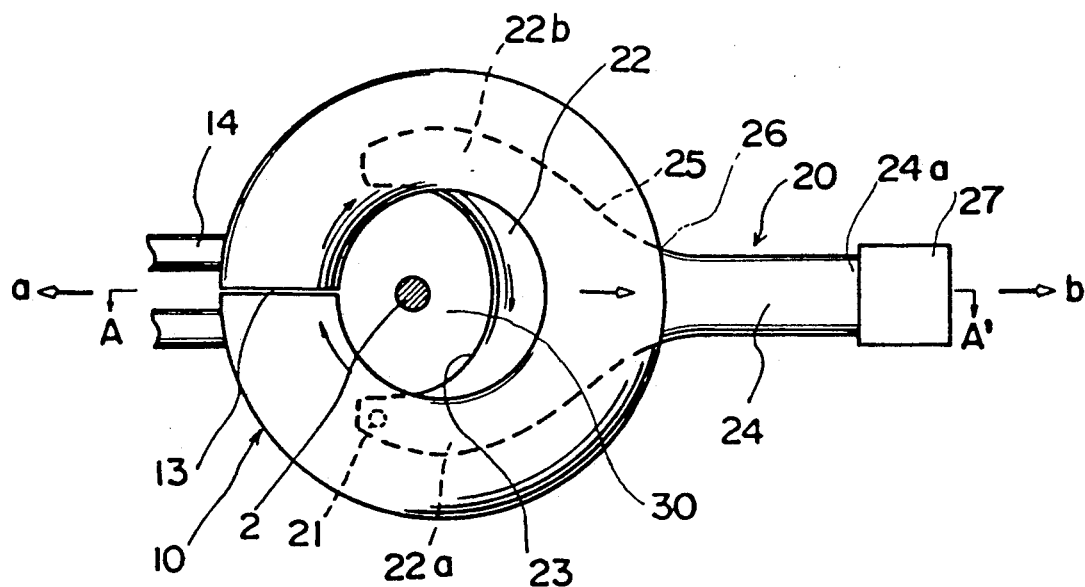
FIGS. 1(A) and 1(B) are schematic top plan views showing a main part arrangement of a semiconductor single crystal manufacturing apparatus according to an embodiment of the present invention, wherein there is each shown a relative movement of a main coil and a metal piece along with the manufacturing sequence of a semiconductor single crystal, and besides, a disposition of the main coil and the metal piece before or after small-diameter crystal growth after nucleating of a seed crystal in FIG. 1(A), and a disposition of the main coil and the metal piece when a floating zone corresponding to a steady diameter of a single crystal is melted in FIG. 1(B)
Figure 1:
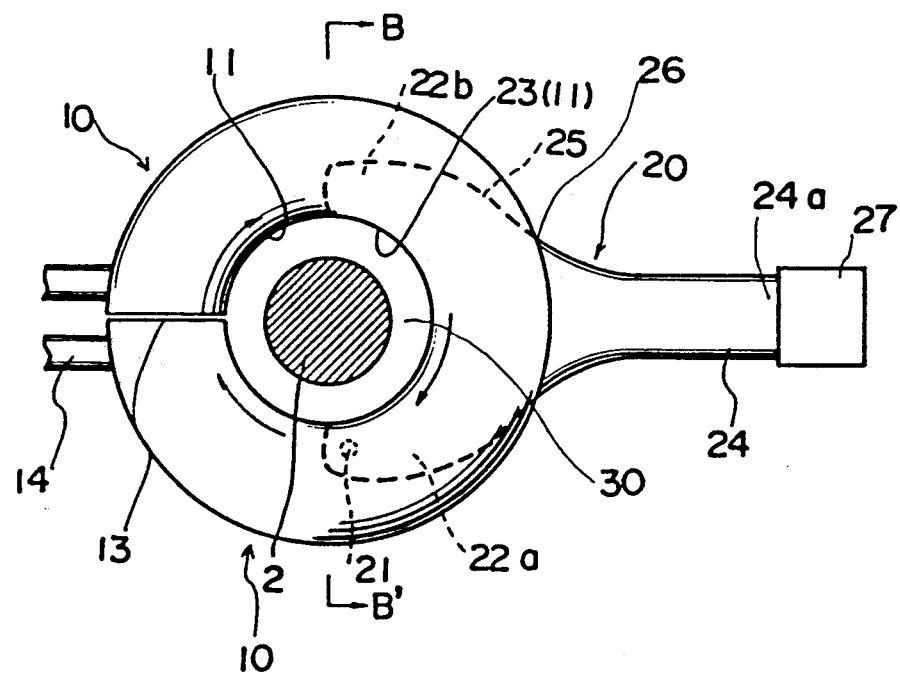
Figure 2:
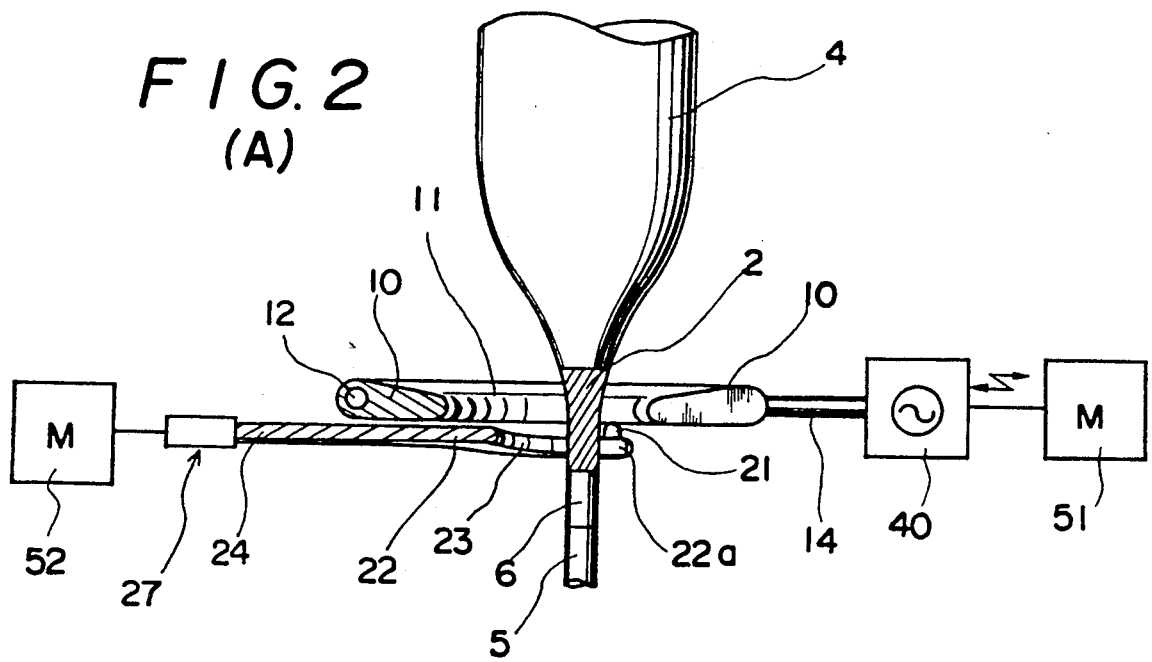
FIGS. 2(A) and 2(B) are respectively sectional views taken along lines A—A' and B—B' in the direction of the arrows in FIGS. 1(A) and 1(B)
Figure 2:
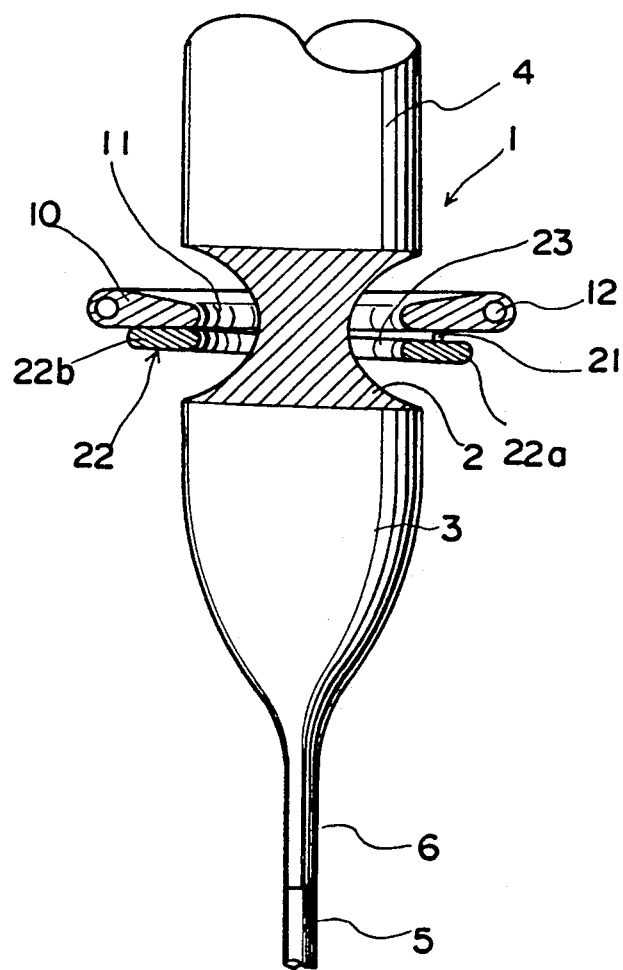

FIGS. 1 and 2 show a main part arrangement of a semiconductor rod melting apparatus according to an embodiment of the present invention. As described above, the apparatus has a single-turn flat main coil 10 which surrounds a floating zone 2 of a semiconductor rod 1 to be melted, and is connected to an RF power supply, and a metal piece 20 which is disposed above or below a lower surface of the main coil 10 is not connected to the RF power supply. The metal piece 20 is arranged in electrical isolation. The coil 10 and the metal piece 20 can be relatively moved on and along the coil surface in directions indicated by arrows a and b to be separated from each other (or to approach each other).

The shape of the main coil 10 will be described in detail. A flat body formed of copper or silver and having a substantially wedge-shaped section is formed into a ring shape, and thereafter, power supply tubes 14 are arranged on the outer peripheral surfaces at two end portions which face each other with a slit gap 13 therebetween, so that an RF induction current is supplied from an RF power supply 40 through the power supply tubes 14. An inner diameter 11 of the coil is set to be smaller than the diameter of a polycrystalline semiconductor rod 4 to be melted, and the section of the coil is formed into a substantially wedge shape. Thus, a magnetic field generated around the coil has an intensity distribution similar to the sectional shape of the main coil, and as a result, induction heating on the semiconductor rod can be concentrated at a narrow region of the periphery. Furthermore, a through hole 12 is formed in the main coil 10 near the outside periphery, and a coolant introduced from the power supply tubes 14 cools the main coil 10 while circulating inside the through hole 12. The sectional shape of the coil 10 is designed as follows. That is, the upper surface of the coil 10 is inclined downward from the outer peripheral edge toward the inner edge 23, and the lower surface is formed to be a substantially horizontal surface. Thus, the metal piece 20 (to be described later) can be slid in a direction perpendicular to the semiconductor rod on and along the lower surface of the main coil 10.

As shown in FIG. 2(A), a driver 51 for reciprocating the coil 10 in the direction of arrow b is coupled to the extending portions of the power supply tubes 14.

The metal piece 20 is formed of a thin flat plate of a metal such as silver or copper (in this case, cooling is necessary), or tungsten or molybdenum. The metal piece 20 is constituted by a linearly extending support portion 24, and a semi-circular arcuated portion 22 which is formed on the leading end portion of the support portion 24 and surrounds partly the semiconductor rod 1.

The inner edge 23 of the arcuated portion 22 is formed into a semi-circular shape having a diameter slightly larger than the inner diameter of the main coil 10, and the span between the distal ends of arms 22a and 22b of the arcuated portion 22 is set to be larger than the inner diameter 11 of the main coil 10. Thus, the inner edge 23 of the arcuated portion always bridges the inside periphery of the main coil 10.

The width of the arcuated portion 22 is set as follows. When the metal piece 20 is moved and the central portion of the inner edge 23 of the arcuated portion 22 coincides with the inner periphery of the main coil 10, as shown in FIG. 1(B), an outer edge 25 does not fall outside the outer periphery 26 of the main coil 10.

A small nodule 21 formed of quartz glass is planted on the upper surface of the arm 22a of the arcuated portion 22. The lower peripheral side of the coil 10 and the metal piece 20 face each other with a small gap with the small nodule 21 therebetween, and the coil 10 and the metal piece 20 are movable on and along the coil surface in directions indicated by arrows a and b to be separated from each other. The size of the nodule 21 is not particularly limited.

In this embodiment, a cooling tube may be arranged around the metal piece 20 to allow water cooling.

An insulating member 27 is attached to an end portion 24a for support of the metal piece 20. The insulating member 27 electrically floats the metal piece 20. In addition, a driver 52 can be mechanically coupled to the metal piece 20 through the insulating member 27, so that the metal piece 20 can be reciprocally moved in the directions indicated by arrows a and b.

As a result, the coil 10 and the metal piece 20 can come close each other or be separated from each other with respect to the semiconductor rod 1 on and along the coil surface in the directions of arrows a and b by the drivers 51 and 52.

The drivers 51 and 52 can only cause the coil 10 and the metal piece 20 to reciprocate in predetermined directions at a predetermined speed which are not particularly limited. For example, the drivers 51 and 52 can be easily actuated by a motor and a cam mechanism, the motor and a rack mechanism, or a spring mechanism.

The operation of this embodiment will be described below.

First, the arcuated portion 22 faces the lower side surface of the main coil 10 while they are in contact with each other through the nodule 21 provided to one arm 22a of the arcuated portion 22 of the metal piece 20. Thereafter, the coil 10 and the metal piece 20 are moved toward the center to approach each other and are stopped at predetermined positions. Thus, as shown in FIGS. 1(A) and 2(A), a substantially elliptic space surrounding the tip of a tapered portion 2a of the starting material polycrystal 4 can be defined between the inner edge 23 of the arcuated portion and the inner diameter 11 of the main coil.

While maintaining the substantially elliptic space, the starting material polycrystal 4 is nucleated on the seed crystal 5. Subsequently, induction heating is continually executed through a high-speed small-diameter single-crystal growth 6.

After the small-diameter single crystal growth 6, the coil 10 and the metal piece 20 are relatively moved on and along the coil surface in the directions of arrows a and b by the drivers 51 and 52 while the coil 10 and the metal piece 20 are relatively moved upward along the axial direction of the semiconductor rod 1 in order to form a conical portion of the single crystal 3 with increasing the diameter thereof. Thus, the space 30 inside the coil is increased in correspondence with a diameter of the manufactured single crystal, and movement of the floating zone 2 and growth of the single crystal 3 can be performed while maintaining electromagnetic coupling well. The movement of the coil 10 and the metal piece 20 is continued until the floating zone 2 reaches a position where the growth of a constant target diameter of the single crystal 3 starts thereat.

As shown in FIGS. 1(B) and 2(B), when the inner edge 23 of the arcuated portion 23 coincides with the inner diameter 11 of the main coil, the movement of the coil 10 and the metal piece 20 is stopped. Thus, the inner periphery 11 of the main coil directly defines the electromagnetic field through which a semiconductor rod to be zone melted. In this state, the coil 10 and the metal piece 20 are relatively moved upward along the axial direction of the semiconductor rod 1, so that melting and single-crystallization of the floating zone 2 can be kept to progress to achieve the constant diameter body of the single crystal 3.

In this case, since one arm 22a of the metal piece 20 is located adjacent to the main coil 10 through the projection 21, an induction current can be flowed near the inner edge 23 of the metal piece 20 synchronized with that of the main coil 10.

Therefore, according to the above embodiment, a large-diameter dislocation-free single crystal can be manufactured.

The embodiment of the present invention comprising the coil 10 and the metal piece 20 can be applied not only to an apparatus for manufacturing a semiconductor single crystal such as germanium, silicon, and the like but also to the manufacture of a compound semiconductor single crystal such as Gallium phosphate. In particular, in the latter case, if one element has higher volatility than other elements and hence a stoichiometry of the constituting elements is apt to change during zone melting, an atmospheric pressure is preferably increased during the melting process and on the top a partial pressure of the volatile element in an atmosphere is recommended.

What is claimed is:

1. A semiconductor rod zone melting apparatus comprising:
   a main induction heating coil surrounding a floating molten zone of a semiconductor rod, said main coil being single-turn flat coil having an inner diameter defining a central opening;
   a single flat metal plate member comprising a pair of arcuate arm members which define an open arcuate portion having a U-shaped inner edge on one side facing said central opening, said inner edge of said open arcuate portion of said metal member having an opening width at least equal to said inner diameter of said main coil;
   an electrically insulating member mounted on said metal member between said metal member and said main coil;
   said metal member being disposed in adjacent contact with an upper or lower surface of said main coil, whereby said insulating member contacts said main coil; and
   said main coil and said metal member being relatively movable with respect to each other perpendicular to an axis defined by said central opening while maintaining contact between said metal member and said main coil, whereby said main coil and said metal member define an opening of variable width in which a concentrated magnetic field is formed upon energizing said main coil.

2. A semiconductor rod zone melting apparatus according to claim 1, wherein one of said arcuate arm members has a free end which is in contact with said main coil through said insulating member, and the other of said arcuate arm members has a free end which directly contacts said main coil.

3. A semiconductor rod zone melting apparatus according to claim 1, wherein said insulating member is a nodule mounted on an upper surface of a free end of one of said arcuate arm members.

4. A semiconductor rod zone melting apparatus according to claim 1, wherein said U-shaped inner edge of said open arcuate portion of said metal member has a diameter and curvature substantially corresponding to that of said central opening of said main coil.

5. A semiconductor rod zone melting apparatus according to claim 1, wherein said main coil is connected to an RF-frequency power supply through a power supply tube.

6. A semiconductor rod zone melting apparatus according to claim 1, wherein said metal plate member further comprises an extending support portion opposite said open arcuate portion, and said support portion comprises an insulating member which serves to electrically isolate said metal member.

7. A semiconductor rod zone melting apparatus according to claim 1, wherein said insulating member is formed of a quartz glass material which is sufficiently temperature-resistant to withstand heat radiated from a floating molten zone of a semiconductor rod.

* * * * *